United States Patent [19]

Kozak

[11] Patent Number: 5,355,103
[45] Date of Patent: Oct. 11, 1994

[54] FAST SETTLING, WIDE DYNAMIC RANGE VECTOR MODULATOR

[75] Inventor: John P. Kozak, Simi Valley, Calif.

[73] Assignee: American Nucleonics Corporation, Westlake, Calif.

[21] Appl. No.: 546,581

[22] Filed: Jun. 29, 1990

[51] Int. Cl.$^5$ .................. H01P 1/22; H03H 5/00; H04B 1/10; H04B 1/18
[52] U.S. Cl. .................. 333/81 R; 333/28 R; 455/304; 455/289
[58] Field of Search .................. 333/81 R, 28 R; 455/289, 296, 303, 305, 304

[56] References Cited

U.S. PATENT DOCUMENTS

| | | | |
|---|---|---|---|
| 3,550,041 | 8/1969 | Sauter | 333/103 |
| 3,699,444 | 10/1972 | Ghose et al. | 455/79 |
| 4,016,516 | 4/1977 | Sauter et al. | 333/81 R |
| 4,737,739 | 4/1988 | Rosier | 333/81 R |
| 4,870,658 | 9/1989 | Suzuki et al. | 333/28 R |

*Primary Examiner*—Gregory C. Issing
*Attorney, Agent, or Firm*—Hoffmann & Baron

[57] ABSTRACT

A fast settling, wide dynamic range vector modulator for use in an interference cancellation system or the like includes a quadrature hybrid which receives an RF signal and divides the signal into a primary in-phase component signal and a primary quadrature phase component signal. A first 180° hybrid receives the primary in-phase component signal and provides first and second secondary in-phase component signals which are 180° out of phase with each other. A second 180° hybrid receives the primary quadrature phase component signal and provides first and second secondary quadrature phase component signals which are 180° out of phase with each other. A first switching device selects one of the first and second secondary in-phase component signals, and a second switching device selects one of the first and second secondary quadrature phase component signals. First and second coarse attenuators respectively provide a selectable amount of attenuation to the selected in-phase and quadrature phase component signals. First and second fine attenuators provide fine attenuation to the coarse attenuated in-phase and quadrature phase component signals. A signal combiner combines the fine attenuated in-phase and quadrature phase component signals to provide the corresponding output signal.

8 Claims, 2 Drawing Sheets

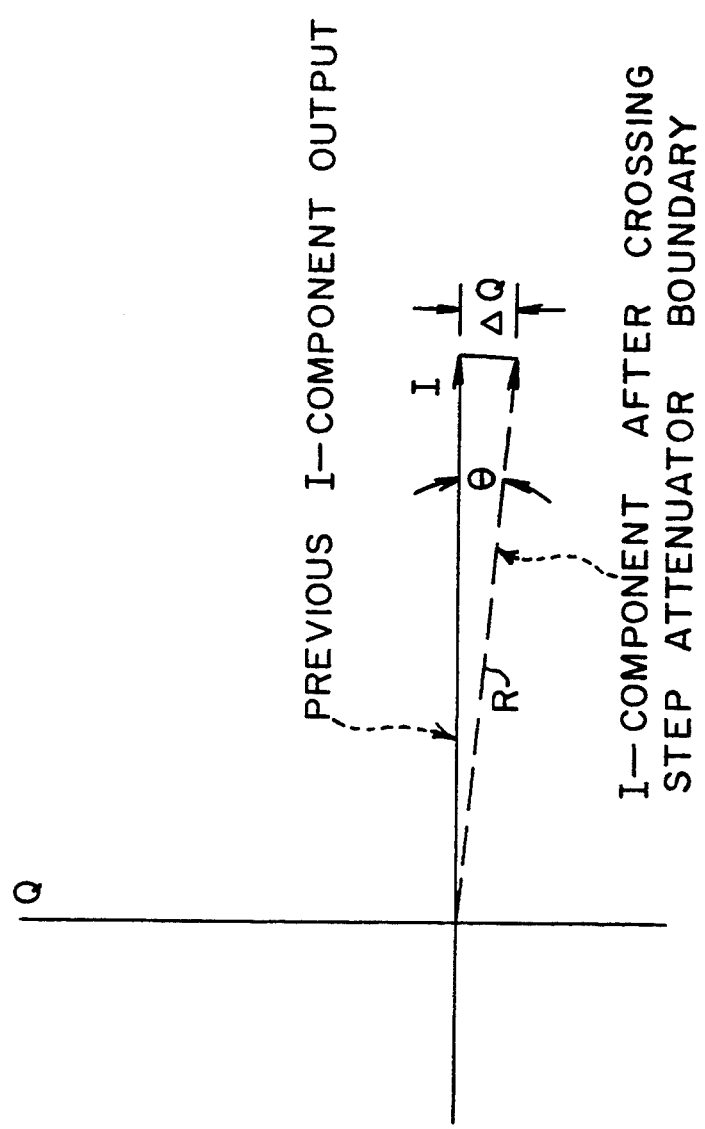

FAST SETTLING, WIDE DYNAMIC RANGE VECTOR MODULATOR

BACKGROUND OF THE INVENTION

1. Field Of The Invention

This invention generally relates to signal controllers, and more specifically relates to a vector modulator which is suitable for use as an RF signal controller in an interference cancellation system. Even more specifically, this invention relates to a vector modulator particularly adapted for high speed, wide dynamic range applications.

2. Description of The Prior Art

A vector modulator is sometimes referred to as a signal controller. It is a circuit which primarily functions to adjust the amplitude and phase of a signal.

One of the primary applications of a vector modulator is in an interference cancellation system, such as disclosed in U.S. Pat. No. 3,699,444, which issued to Rabindra Ghose et al. In such an interference cancellation system, the vector modulator generally receives a sample of a transmitter signal, which may be causing interference in a collocated receiver system, and adjusts the amplitude and phase of the sampled signal to provide a cancellation or correction signal which is essentially the negative complement of the transmitter signal. The cancellation signal is injected into the signal path of the receiver system to cancel or at least minimize the interference caused by the transmitter signal.

Generally, the vector modulator works in conjunction with a synchronous or coherent detector and a loop amplifier and filter. The detector compares a sample of the received signal with that of the transmitter signal and provides control signals to the vector modulator via the control loops that minimize the synchronous detection products of the two sampled signals. The vector modulator adjusts the amplitude and phase of the sampled transmitter signal in accordance with the control signals it receives from the control loops.

More specifically, the vector modulator adjusts the amplitude of the in-phase and quadrature phase, or sine and cosine, components of the reference or sampled transmitter signal. By so doing, a cancellation signal may be provided with the desired amplitude and phase angle. Accordingly, a typical vector modulator, such as disclosed in the Ghose et al. patent, includes two signal controllers 39, 40, each for respectively modifying the in-phase or sine component and the quadrature phase or cosine component of the sampled signal.

An early form of a signal controller is disclosed in U.S. Pat. No. 3,550,041, which issued to Walter Sauter. FIG. 1 of this patent shows a signal controller having a transformer 13 which basically provides two output signals corresponding to the input RF signal, which output signals have a phase angle difference of 180°. The secondary winding of the transformer 13 is connected to two PIN diodes 20, 21. A DC bias signal provided to each PIN diode allows one or the other of the output signals to be selected. By adjusting the bias signals, attenuation of the selected signal may be controlled. In effect, two such signal controllers would be required in forming a vector modulator, each controller being employed to adjust in amplitude either the in-phase or the quadrature phase component of the RF signal.

U.S. Pat. No. 4,016,516, which issued to Walter Sauter, et al., discloses another conventional vector modulator, which is referred to in the patent as a signal controller. As shown in FIG. 3 of the Sauter, et al. patent, a quadrature hybrid 51 is used to produce the in-phase and quadrature phase components of a reference signal, and an in-phase hybrid or zero degree summer 60 is used to sum the components back together.

Each of the in-phase and quadrature phase components is adjusted in amplitude by using a quadrature hybrid 55, 56 and a pair of PIN diodes 61, 62 and 63, 64, used as terminations. The bias of the PIN diodes is controlled in a manner similar to that described in U.S. Pat. No. 3,550,041 to adjust the amount of the in-phase and quadrature phase components which is absorbed by the PIN diodes and the amount which is reflected through the quadrature hybrids 55, 56 and summed in the zero degree summer 60 to produce a cancellation signal.

The signal controllers (or vector modulators) disclosed in U.S. Pat. Nos. 3,550,041 and 4,016,516 work well in many applications. However, the application of interference cancellation techniques to frequency agile and broad instantaneous bandwidth systems requires increased vector modulator performance, and in such applications, the signal controllers disclosed in the aforementioned patents may have limited capabilities due primarily to the PIN diodes employed in the controllers, and their associated insertion phase variation over the amplitude control range.

Many conventional interference cancellation systems are of the fixed geometry, fixed frequency type. That is, the geometry between the interfering signal source and the receiver antenna is fixed, and also such interference cancellation systems tend to operate with a very narrow bandwidth and at a particular frequency. Once the system is tuned up, there is relatively little change in the in-phase and quadrature phase loops of the system that the vector modulator would experience.

However, in an interference cancellation system which must be able to respond to many different frequencies and in which the antennas have a different response at such frequencies, the in-phase and quadrature phase control values may change radically. The vector modulator must be capable of responding quickly and accurately to such changes.

Thus, frequency agile systems require the vector modulator to respond quickly after being commanded from a previous setting. PIN diodes have relatively large parasitic capacitances, which tend to slow down the response time of the signal controller or vector modulator employing the diodes, as it is difficult to move charge quickly in and out of the diode's capacitance. Smaller geometry PIN diodes may be employed in the vector modulator to improve response time, but not without a reduction in power handling capability and a corresponding increase in the amplitude of distortion products.

In many interference cancellation system applications, vector modulators must be capable of handling large input signal powers. To handle such large input powers, conventional vector modulators would require large geometry PIN diodes. Larger geometry PIN diodes correspondingly have greater parasitic capacitance, which tends to slow down the response time of the vector modulator. Accordingly, there is a speed/power tradeoff when using a PIN diode in a vector modulator.

Another problem with PIN diode type vector modulators is that the phase and amplitude response of the vector modulator may vary with respect to frequency. PIN diodes, especially those which are capable of handling larger power levels, are fairly large devices. Many PIN diodes tend to be discrete components, as opposed to monolithically formed chip type devices, and thus have lead inductances and parasitic capacitances associated with them. Their intrinsic characteristics form resonant circuits, which may cause the vector modulator to change in its response as a function of the frequency of the signal it is handling. This affects the performance characteristics of the interference cancellation system in which the vector modulator is used.

Similarly, the phase and amplitude response of conventional PIN diode modulators may be affected by thermal drift in the PIN diodes. In conventional vector modulators, the PIN diodes must absorb a sizeable portion of the signal power. The diodes tend to heat up, which may cause their electrical characteristics, such as their RF resistance, to change. As a result, the phase and amplitude correction the PIN diode modulator imparts to the RF signal may differ from the correction expected from the values applied to the bias or control ports of the vector modulator by the control loops.

Another problem with many conventional vector modulators used in interference cancellation systems is that their insertion phase tends to vary as a function of the attenuation they apply to the signal. If the insertion phase of each of the in-phase and quadrature phase paths through the vector modulator is not independent of its attenuation setting, the relationship between the in-phase and quadrature phase components will deviate from 90° after passing through the signal controller portions of the modulator. Furthermore, each component will differ in phase from its counterpart in the synchronous detector. Accordingly, a change in the in-phase component due to the insertion phase shift will affect the quadrature phase component. The quadrature phase signal control loop of the interference cancellation system will accordingly make a correction to the quadrature phase component, and that correction will, in turn, impact the in-phase signal control loop of the system. In other words, the two system control loops will no longer be independent of each other. A change in the output of one control loop will affect the other, and this will prolong the "settling time" of the entire cancellation system.

OBJECTS AND SUMMARY OF THE INVENTION

It is an object of the present invention to provide a vector modulator which is particularly adapted for high speed, wide dynamic range applications.

It is another object of the present invention to provide a vector modulator having a relatively short response time.

It is a further object of the present invention to provide a vector modulator having an insertion phase which remains relatively constant over a relatively large attenuation range.

It is yet a further object of the present invention to provide a vector modulator which has a relatively flat phase and amplitude response over a relatively large frequency range and is thus capable of broadband operation.

It is still another object of the present invention to provide a vector modulator which is adapted for use in an interference cancellation system.

It is yet a further object of the present invention to provide a vector modulator which overcomes the inherent disadvantages of known vector modulators.

A vector modulator formed in accordance with one form of the present invention includes a quadrature hybrid. The quadrature hybrid receives an RF signal to be adjusted, and provides a primary in-phase component and a primary quadrature phase component signal corresponding to the RF signal.

A first 180° hybrid is connected to one output port of the quadrature hybrid and receives the primary in-phase component signal. The first 180° hybrid provides first and second secondary in-phase component signals, each corresponding to the primary in-phase component signal. The first secondary in-phase component signal is 180° out of phase with the second secondary in-phase component signal.

A second 180° hybrid is also included, and is connected to the other output port of the quadrature hybrid and receives the primary quadrature phase component signal. The second 180° hybrid provides first and second secondary quadrature phase component signals, each corresponding to the primary quadrature phase component signal. The first secondary quadrature phase component signal is 180° out of phase with the second secondary quadrature phase component signal.

The vector modulator also includes a first switching device for selecting one of the first and second secondary in-phase component signals in response to a first control signal. The first switching device provides a selected in-phase component signal corresponding to one of the first and second secondary in-phase component signals.

A second switching device is also included and selects one of the first and second secondary quadrature phase component signals in response to a second control signal. The second switching device provides a selected quadrature phase component signal corresponding to one of the first and second secondary quadrature phase component signals.

The vector modulator further includes a first coarse attenuator. The first coarse attenuator provides coarse attenuation to the selected in-phase component signal. The first coarse attenuator receives the selected in-phase component signal and attenuates the selected in-phase component signal by a predetermined amount in accordance with a third control signal provided to it. The first coarse attenuator then provides a coarse attenuated in-phase component signal.

The vector modulator also includes a second coarse attenuator for providing coarse attenuation to the selected quadrature phase component signal. The second coarse attenuator receives the selected quadrature phase component signal and attenuates the selected quadrature phase component signal by a predetermined amount in accordance with a fourth control signal provided to it. The second coarse attenuator provides a coarse attenuated quadrature phase component signal.

The vector modulator also includes first and second fine attenuators. The first fine attenuator provides fine attenuation to the selected in-phase component signal. The first fine attenuator receives the coarse attenuated in-phase component signal and attenuates the coarse attenuated in-phase component signal by a predetermined amount in accordance with a fifth control signal provided to it. The first fine attenuator provides a fine attenuated in-phase component signal.

The second fine attenuator provides fine attenuation to the selected quadrature phase component signal. The second fine attenuator receives the coarse attenuated quadrature phase component signal and attenuates the coarse attenuated quadrature phase component signal by a predetermined amount in accordance with a sixth control signal provided to it. The second fine attenuator provides a fine attenuated quadrature phase component signal.

The vector modulator further includes a signal combiner for combining the fine attenuated in-phase and quadrature phase component signals. The signal combiner receives and sums the fine attenuated in-phase component signal and the fine attenuated quadrature phase component signal, and provides an adjusted signal which corresponds to the vector sum of the two signals.

The vector modulator may also include a control interface device which provides the first and second control signals to the first and second switching device, the third and fourth control signals to the first and second coarse attenuator, and the fifth and sixth control signals to the first and second fine attenuator.

These and other objects, features and advantages of this invention will be apparent from the following detailed description of illustrative embodiments thereof, which is to be read in connection with the accompanying drawings.

BRIEF DESCRIPTION OF THE DRAWINGS

FIG. 2 is a pictorial representation of the in-phase and quadrature phase components, illustrating the effect of one component on the other due to attenuation changes in the vector modulator.

DETAILED DESCRIPTION OF THE PREFERRED EMBODIMENTS

Figure 1:
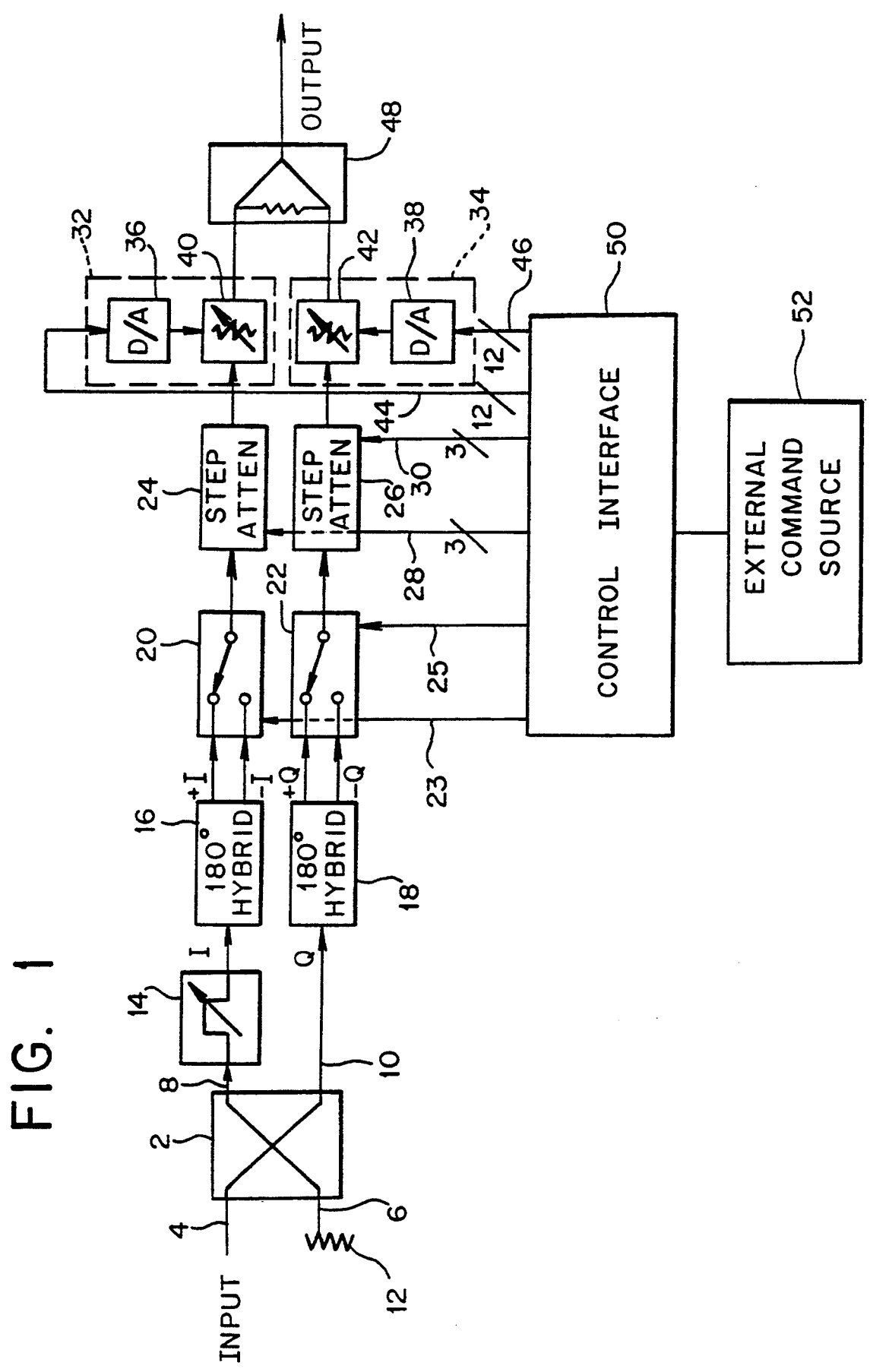
FIG. 1 is a block diagram of a vector modulator formed in accordance with the present invention.

Referring initially to FIG. 1 of the drawings, it will be seen that a vector modulator, constructed in accordance with one form of the present invention, includes a quadrature hybrid 2 or similar device. The quadrature hybrid 2 includes two input ports 4, 6, and two output ports 8, 10. One input port 4 receives an input RF signal which is to be adjusted in phase and amplitude. The other input port 6 is terminated using an appropriate termination 12.

As its name implies, the quadrature hybrid 2 provides two output signals which are 90° out of phase with each other. The first output signal is termed a primary in-phase component signal, and is provided on output port 8. The second output signal is termed a primary quadrature phase component signal, and is provided on output port 10. The primary in-phase component signal and the primary quadrature phase component signal correspond to the RF signal provided on input port 4.

The primary in-phase component signal provided on output port 8 of quadrature hybrid 2 is provided to a phase adjustment device 14. The phase adjustment device 14 may be in the form of a variable delay line or the like. The purpose of the phase adjustment device 14 is for adjusting for any phase difference from the desired 90° between the primary in-phase component signal and the primary quadrature phase component signal. More specifically, the phase adjustment device 14 is provided to adjust for cabling differences and insertion phase differences between components in the in-phase and quadrature phase paths of the vector modulator so that the two paths may be tuned to achieve a substantially perfect 90° balance between the primary in-phase component signal and the primary quadrature phase component signal.

Although FIG. 1 illustrates the phase adjustment device as being connected to output port 8 and being provided in the signal line carrying the primary in-phase component signal, device 14 may have been connected to the output port 10 of quadrature hybrid 2 to receive and adjust the primary quadrature phase component signal to ensure that the primary in-phase and quadrature phase component signals are 90° apart from each other. Alternatively, two phase adjustment devices may be included in the vector modulator, one in the signal line carrying the primary in-phase component signal to adjust the primary in-phase component signal and the other in the signal line carrying the primary quadrature phase component signal to adjust the primary quadrature phase component signal.

As illustrated by FIG. 1, the primary in-phase component signal, which has passed through phase adjustment device 14, is provided to a first 180° hybrid 16. The first 180° hybrid 16 is responsive to the primary in-phase component signal and includes two output ports on which are respectively provided first and second secondary in-phase component signals (designated in FIG. 1 as +I and −I). Each of the first and second secondary in-phase component signals corresponds to the primary in-phase component signal. As its name implies, the 180° hybrid 16 provides a first secondary in-phase component signal which is 180° out of phase with the second secondary in-phase component signal.

Similarly, the primary quadrature phase component signal on output port 10 of quadrature hybrid 2 is provided to the input of a second 180° hybrid 18. Like hybrid 16, the 180° hybrid 18 takes the primary quadrature phase component signal and resolves it into two signals which are 180° out of phase with respect to each other. More specifically, the second 180° hybrid 18 has two output ports on which are respectively provided first and second secondary quadrature phase component signals (designated in FIG. 1 by +Q and −Q). Each of the first and second secondary quadrature phase component signals corresponds to the primary quadrature phase component signal provided to hybrid 18. The first secondary quadrature phase component signal is 180° out of phase with the second secondary quadrature phase component signal.

The vector modulator further includes two switching devices 20, 22. Each switching device 20, 22 is schematically illustrated in FIG. 1 as a single pole, double throw switch, and effectively operates in that manner. Devices 20, 22 may be GaAs FET RF switches, PIN diode RF switches, or the like.

The first switching device 20 is provided for selecting one of the first and second secondary in-phase component signals, and receives these signals from the output ports of the 180° hybrid 16. The first switching device 20 selects either secondary in-phase component signal in response to a first control signal provided to it, and provides on its output a selected in-phase component signal corresponding to one of the secondary in-phase component signals.

The second switching device 22 similarly selects one of the first and second secondary quadrature phase component signals in response to a second control signal provided to it. Switching device 22 receives the first and second secondary quadrature phase component signals from 180° hybrid 18, and provides a selected quadrature phase component signal on its output which corresponds to one of the secondary quadrature phase component signals.

A suitable RF switch which may be used for the first and second switching devices 20, 22 is model no. SW-215 manufactured by Anzac, a division of Adam-Russell Co., Inc. of Burlington, Massachusetts- Switching devices 20, 22 may be digitally controlled such that the first and second control signals are single bit digital words provided to the switching devices on data lines 23, 25, respectively.

The selected in-phase component signal from the first switching device 20 is provided to a first coarse attenuator 24. The first coarse attenuator 24 provides coarse attenuation to the selected in-phase component signal. The first coarse attenuator 24 attenuates the selected in-phase component signal by a predetermined amount in accordance with a third control signal provided to it, and provides on its output a coarse attenuated in-phase component signal.

Similarly, the selected quadrature phase component signal from the second switching device 22 is provided to a second coarse attenuator 26. Second coarse attenuator 26 provides coarse attenuation to the selected quadrature phase component signal. The second coarse attenuator 26 attenuates the selected quadrature phase component signal by a predetermined amount in accordance with a fourth control signal provided to it, and provides on its output a coarse attenuated quadrature phase component signal.

The first and second coarse attenuators 24, 26 may be in the form of step attenuators, each of which is comprised of selectively switched attenuation pads. The step attenuators are digitally controlled to add or remove a predetermined amount of attenuation to the selected in-phase and quadrature phase component signals provided to the coarse attenuators. Each of the third and fourth control signals is in the form of three bit digital data and is respectively provided to its corresponding coarse attenuator on a three bit data bus 28, 30. A suitable step attenuator for use as the first and second coarse attenuator 24, 26 is model no. DAO-041 manufactured by Anghel Labs, Inc. of Rockaway, New Jersey, or one of the MA4GM400 series of attenuators manufactured by M/A-Com, Inc. of Burlington, Massachusetts. The first and second coarse attenuators 24, 26 respectively provide on their outputs a coarse attenuated in-phase component signal and a coarse attenuated quadrature phase component signal.

The coarse attenuated in-phase component signal from the first coarse attenuator 24 is provided to a first fine attenuator 32. The first fine attenuator provides fine attenuation to the selected in-phase component signal. The first fine attenuator 32 attenuates the coarse attenuated in-phase component signal by a predetermined amount in accordance with a fifth control signal provided to the first fine attenuator 32, and provides a fine attenuated in-phase component signal on its output.

Similarly, the coarse attenuated quadrature phase component signal from the second coarse attenuator 26 is provided to a second fine attenuator 34. The second fine attenuator 34 provides fine attenuation to the selected quadrature phase component signal. The second fine attenuator 34 attenuates the coarse attenuated quadrature phase component signal by a predetermined amount in accordance with a sixth control signal provided to the second fine attenuator 34, and provides a fine attenuated quadrature phase component signal on its output.

Each of the first and second fine attenuators 32, 34 has a usable attenuation range which is respectively greater than the predetermined amount of attenuation provided by each coarse attenuator 24, 26 by a predetermined amount of attenuation, as will be explained.

Preferably, each of the first and second fine attenuators 32, 34 is digitally controlled and includes a digital-to-analog converter 36, 38 whose analog output is provided to a variable (i.e., analog) attenuator 40, 42. Variable attenuators 40, 42 are preferably microwave monolithic integrated circuit (MMIC) devices, such as model no. MA4GM301L manufactured by M/A-Com, Inc.

For greater resolution, the digital-to-analog converters 36, 38 used in the first and second fine attenuators 32, 34 are preferably 12 bit devices and, accordingly, the fifth and sixth control signals provided to the digital-to-analog converters are 12 bit digital words provided on 12 bit data bus lines 44, 46, respectively.

The fine attenuated in-phase component signal from the first fine attenuator 32, and the fine attenuated quadrature phase component signal from the second fine attenuator 34 are provided to a signal combiner 48. The signal combiner sums the fine attenuated in-phase and quadrature phase component signals and provides an adjusted signal on its output which corresponds to the vector sum of the two. By selecting one of the first and second secondary in-phase component signals (+I and −I) and one of the first and second secondary quadrature phase component signals (+Q and −Q), and by providing a predetermined amount of attenuation to each of these selected signals, the vector modulator of the present invention provides an adjusted output signal having the desired phase and amplitude. When used in an interference cancellation system, the correction or adjusted signal produced by the vector modulator may be used to cancel an interfering signal in a receiver system to which the interference cancellation system is coupled.

The vector modulator of the present invention may further include a control interface circuit 50. The control interface circuit may be in the form of a serial to parallel converter and transparent latching circuit, and provides the first and second control signals to the first and second switching devices 20, 22 in order to select one of each of the first and second secondary in-phase component signals and first and second secondary quadrature phase component signals, the third and fourth control signals to the first and second coarse attenuators 24, 26, and the fifth and sixth control signals to the first and second fine attenuators 32, 34. The control interface circuit 50 essentially decodes and distributes to the vector modulator elements command data provided to it from an external source 52, for example, the control loops of an interference cancellation system.

As mentioned previously, each of the first and second fine attenuators 32, 34 has a usable attenuation range which is respectively greater than the predetermined amount of attenuation of each step of attenuation provided by each of the first and second coarse attenuators 24, 26.

For example, each step of the coarse attenuators 24, 26 preferably provides 8 dB of attenuation. The fine attenuators 32, 34 are preferably selected to provide 10 dB of attenuation over their entire range, thus providing a 2 dB overlap. This overlap in attenuation between the fine attenuators and the coarse attenuators provides a certain amount of "hysteresis" to avoid an oscillatory condition and to minimize the settling time of the system in which the vector modulator is used. The reason for the attenuation overlap between the fine and coarse attenuators and the method used to calculate the approximate amount of hysteresis needed are described below with reference to FIG. 2.

Without some overlap of the coarse attenuator step boundaries by the fine attenuator, phase discontinuities at a coarse attenuator step boundary may cause a lack of convergence to the desired output vector. If, for example, a step change in one of the coarse attenuators 24, 26 causes a 2° phase shift in the in-phase path of the vector modulator and, a corresponding full range change in the fine attenuator 32, 34 of the same path as it is reset to the other end of its range causes a 5° phase shift in the in-phase path, the combined phase shift causes a change in the amplitude of the quadrature phase component at the output of the vector modulator, since the in-phase path is now contributing to the quadrature component of the vector modulator output. This resultant change in the amplitude of the quadrature phase component requires an adjustment of the coarse or fine attenuators in the quadrature phase path of the vector modulator. An adjustment of the attenuators in the quadrature phase path of the vector modulator may, in turn, result in a phase shift in the quadrature phase path and affect the amplitude of the in-phase component, requiring an additional change in attenuators of the in-phase path of the vector modulator.

The worst case appears to occur when the in-phase component signals and the quadrature phase component signals at the attenuators of the vector modulator have the same amplitude, and both the in-phase and quadrature phase coarse attenuators 24, 26 are near step boundaries. Accordingly, a sufficient amount of overlap in attenuation between the fine attenuators and the coarse attenuators is provided to eliminate the chance of the coarse attenuators oscillating back and forth across step boundaries, causing lack of vector modulator convergence to the desired output vector. The amount of attenuation overlap between the fine attenuators and the coarse attenuators is a function of the maximum change in the quadratured component.

As shown in FIG. 2, if the in-phase component I crosses a step boundary of the coarse attenuator, it causes a relatively small change in the in-phase component but a relatively larger change in the quadrature component Q. A change in the quadrature component is given by the trigonometric equation $\Delta Q = R \sin(\Theta)$, where R represents the magnitude of the in-phase component, and $\Theta$ represents the total possible phase shift due to the combined changes in the coarse attenuator and the fine attenuator.

If, as assumed previously, a step attenuation change in the coarse attenuator causes a 2° phase shift, and a range change in the fine attenuator causes a 5° phase shift in the in-phase path of the vector modulator, the total phase shift for the in-phase path is 7°. Accordingly, $\Delta Q = R \sin 7°$ which equals $0.122R$, which approximately equals a 1.1 dB change.

For this reason, a 2 dB overlap in attenuation is preferably chosen. Thus, any insertion change due to crossing a coarse attenuator boundary in one path through the vector modulator will only cause the system to readjust the fine attenuator of the quadrature phase path—the coarse attenuator of the quadrature phase path would not need to be adjusted, as the maximum adjustment needed would be within the 2 dB extended range of the fine attenuator.

There are a number of advantages to providing a coarse attenuator 24, 26 and a fine attenuator 32, 34 for each path of the vector modulator. Because of changing parasitic capacitance, each fine attenuator will exhibit a greater phase shift over its attenuation range than the coarse attenuators. Furthermore, the magnitude of this insertion phase change increases as the attenuation range of this continuously variable attenuator is increased. However, this vector modulator preferably employs a GaAs MMIC attenuator having less insertion phase change than its PIN diode counterparts, and the arrangement of the coarse and fine attenuators described previously minimizes the range of use of each fine attenuator, which in turn minimizes the unintentional phase shifts in the vector modulator.

The coarse attenuators 24, 26 on the other hand are preferably composed of passive resistive elements which are selectively switched in and out of the in-phase and quadrature phase paths, enabling the coarse attenuator to cause relatively inconsequential phase shifts in the vector modulator over a much greater dynamic range of operation than the fine attenuator.

Additionally, the advantage of using a coarse attenuator having a series of selectable passive elements is that the insertion phase over the full dynamic range of the coarse attenuator is substantially the same. For a three bit, 8 dB/step coarse attenuator, a 56 dB range in attenuation may be provided. Eight different attenuation values may be selected without substantially changing the insertion phase.

The vector modulator of the present invention is particularly adapted to frequency agile, wide dynamic range interference cancellation system applications for three basic reasons. First, the fast settling time of the GaAs M4IC fine and coarse attenuators provides improved command response time compared with PIN attenuator implementations of the prior art at the same power handling capacity. Second, the constant phase nature of this vector modulator over wide dynamic range compared with conventional vector modulators allows one to decouple the in-phase and quadrature phase loops of the interference cancellation system to keep the two loops independent, thereby decreasing the system tracking and settling time. Third, the vector modulator would also allow an interference cancellation system to handle interference signals over a wide frequency range, as the attenuators of this vector modulator are broader band in their frequency response than those of the prior art, improving the usable bandwidth of the vector modulator.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A vector modulator, which comprises:
   means responsive to an RF signal for providing a primary in-phase component signal and a primary quadrature phase component signal corresponding to the RF signal;

means responsive to the primary in-phase component signal for providing first and second secondary in-phase component signals, each corresponding to the primary in-phase component signal, the first secondary in-phase component signal being 180° out of phase with the second secondary in-phase component signal;

means responsive to the primary quadrature phase component signal for providing first and second secondary quadrature phase component signals, each corresponding to the primary quadrature phase component signal, the first secondary quadrature phase component signal being 180° out of phase with the second secondary quadrature phase component signal;

first switching means for selecting one of the first and second secondary in-phase component signals in response to a first control signal, and providing a selected in-phase component signal corresponding thereto;

second switching means for selecting one of the first and second secondary quadrature phase component signals in response to a second control signal, and providing a selected quadrature phase component signal corresponding thereto;

first coarse attenuation means for providing coarse attenuation to the selected in-phase component signal, the first coarse attenuation means being responsive to the selected in-phase component signal and attenuating the selected in-phase component signal by a predetermined amount in accordance with a third control signal provided to the first coarse attenuation means, and providing a coarse attenuated in-phase component signal;

second coarse attenuation means for providing coarse attenuation to the selected quadrature phase component signal, the second coarse attenuation means being responsive to the selected quadrature phase component signal and attenuating the selected quadrature phase component signal by a predetermined amount in accordance with a fourth control signal provided to the second coarse attenuation means, and providing a coarse attenuated quadrature phase component signal;

first fine attenuation means for providing fine attenuation to the selected in-phase component signal, the first fine attenuation means being responsive to the coarse attenuated in-phase component signal and attenuating the coarse attenuated in-phase component signal by a predetermined amount in accordance with a fifth control signal provided to the first fine attenuation means, and providing a fine attenuated in-phase component signal;

second fine attenuation means for providing fine attenuation to the selected quadrature phase component signal, the second fine attenuation means being responsive to the coarse attenuated quadrature phase component signal and attenuating the coarse attenuated quadrature phase component signal by a predetermined amount in accordance with a sixth control signal provided to the second fine attenuation means, and providing a fine attenuated quadrature phase component signal; and signal combining means for combining the fine attenuated in-phase and quadrature phase component signals, the signal combining means being responsive to and summing the fine attenuated in-phase component signal and the fine attenuated quadrature phase component signal, and providing an output signal corresponding thereto.

2. A vector modulator, which comprises:

a quadrature hybrid, the quadrature hybrid receiving an RF signal and providing a primary in-phase component signal and a primary quadrature phase component signal corresponding to the RF signal;

a first 180° hybrid, the first 180° hybrid being responsive to the primary in-phase component signal and providing first and second secondary in-phase component signals, each corresponding to the primary in-phase component signal, the first secondary in-phase component signal being 180° out of phase with the second secondary in-phase component signal;

a second 180° hybrid, the second 180° hybrid being responsive to the primary quadrature phase component signal and providing first and second secondary quadrature phase component signals, each corresponding to the primary quadrature phase component signal, the first secondary quadrature phase component signal being 180° out of phase with the second secondary quadrature phase component signal;

first switching means for selecting one of the first and second secondary in-phase component signals in response to a first control signal, and providing a selected in-phase component signal corresponding thereto;

second switching means for selecting one of the first and second secondary quadrature phase component signals in response to a second control signal, and providing a selected quadrature phase component signal corresponding thereto;

a first coarse attenuator for providing coarse attenuation to the selected in-phase component signal, the first coarse attenuator being responsive to the selected in-phase component signal and attenuating the selected in-phase component signal by a predetermined amount in accordance with a third control signal provided to the first coarse attenuator, and providing a coarse attenuated in-phase component signal;

a second coarse attenuator for providing coarse attenuation to the selected quadrature phase component signal, the second coarse attenuator being responsive to the selected quadrature phase component signal and attenuating the selected quadrature phase component signal by a predetermined amount in accordance with a fourth control signal provided to the second coarse attenuator, and providing a coarse attenuated quadrature phase component signal;

a first fine attenuator for providing fine attenuation to the selected in phase component signal, the first fine attenuator being responsive to the coarse attenuated in-phase component signal and attenuating the coarse attenuated in-phase component signal by a predetermined amount in accordance with a fifth control signal provided to the first fine attenuator, and providing a fine attenuated in-phase component signal;

a second fine attenuator for providing fine attenuation to the selected quadrature phase component signal, the second fine attenuator being responsive to the coarse attenuated quadrature phase component signal and attenuating the coarse attenuated quadrature phase component signal by a predetermined amount in accordance with a sixth control signal provided to the second fine attenuator, and providing a fine attenuated quadrature phase component signal; and a signal combiner for combining the fine attenuated in-phase and quadrature phase component signals, the signal combiner being responsive to and summing the fine attenuated in-phase component signal and the fine attenuated quadrature phase component signal, and providing an output signal corresponding thereto.

3. A vector modulator as defined by claim 2, which further comprises phase adjustment means for adjusting for a phase difference between the primary in-phase component signal and the primary quadrature component signal, the phase adjustment means being responsive to at least one of the primary in-phase component signal and the primary quadrature phase component signal.

4. A vector modulator as defined by claim 2, wherein each of the first and second fine attenuators includes an analog attenuator and a digital-to-analog converter operatively coupled to the analog attenuator, the digital-to-analog converter of the first and second fine attenuators being respectively responsive to the fifth and sixth control signals.

5. A vector modulator as defined by claim 2, wherein each of the first and second coarse attenuators is a step attenuator and respectively provides attenuation to the selected in-phase and quadrature phase component signals in a series of finite steps, each attenuator step providing a first predetermined amount of attenuation.

6. A vector modulator as defined by claim 5, wherein each of the first and second fine attenuators has a usable attenuation range which is respectively greater than the first predetermined amount of attenuation provided by each coarse attenuator by a second predetermined amount of attenuation.

7. A vector modulator as defined by claim 2, which further comprises control interface means for providing first and second control signals to control respectively the first and second switching means, third and fourth control signals to control respectively the first and second coarse attenuator and fifth and sixth control signals to control respectively the first and second fine attenuator.

8. A vector modulator as defined by claim 7, wherein the control interface means includes a serial to parallel converter and transparent latching circuit.

* * * * *